(12) United States Patent
Kim et al.

(10) Patent No.: US 8,431,981 B2
(45) Date of Patent: Apr. 30, 2013

(54) SEMICONDUCTOR MEMORY DEVICE HAVING VERTICAL TRANSISTOR AND BURIED BIT LINE AND METHOD FOR FABRICATING THE SAME

(75) Inventors: Baek Mann Kim, Yongin-si (KR); Jun Ki Kim, Seoul (KR); Yong Seok Eun, Seongnam-si (KR); Kyong Bong Rouh, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 55 days.

(21) Appl. No.: 13/077,116

(22) Filed: Mar. 31, 2011

(65) Prior Publication Data
US 2012/0007171 A1    Jan. 12, 2012

(30) Foreign Application Priority Data
Jul. 7, 2010    (KR) .................. 10-2010-0065592

(51) Int. Cl.
  *H01L 27/108*    (2006.01)
  *H01L 21/8242*    (2006.01)
(52) U.S. Cl.
  USPC .......................................... 257/302; 438/244
(58) Field of Classification Search .......... 438/242–244, 438/259, 270; 257/301–303
  See application file for complete search history.

(56) References Cited

U.S. PATENT DOCUMENTS

| 6,552,382 | B1* | 4/2003 | Wu | 257/305 |
| 6,808,979 | B1* | 10/2004 | Lin et al. | 438/242 |
| 2004/0094786 | A1 | 5/2004 | Tran et al. | |
| 2007/0040200 | A1 | 2/2007 | Tran et al. | |
| 2007/0190725 | A1 | 8/2007 | Kim et al. | |
| 2007/0295995 | A1 | 12/2007 | Yun et al. | |
| 2010/0237423 | A1 | 9/2010 | Yun et al. | |

FOREIGN PATENT DOCUMENTS
KR    100739532 B1    9/2007

\* cited by examiner

*Primary Examiner* — Calvin Lee
(74) *Attorney, Agent, or Firm* — William Park & Associates Ltd.

(57) ABSTRACT

A semiconductor memory device includes an active region protruding upward from a substrate, wherein the active region is arranged next to a trench on the substrate, a first impurity region formed at an upper portion of the active region, a second impurity region formed at a lower portion of the active region, a gate dielectric layer formed along a side of the active region between the first impurity region and the second impurity region, a gate electrode layer formed on the gate dielectric layer, a buried bit line formed at a lower portion of the trench, and a polysilicon layer formed over the buried bit line, wherein the polysilicon layer electrically connects the buried bit line with the second impurity region.

10 Claims, 7 Drawing Sheets

SEMICONDUCTOR MEMORY DEVICE HAVING VERTICAL TRANSISTOR AND BURIED BIT LINE AND METHOD FOR FABRICATING THE SAME

CROSS-REFERENCES TO RELATED APPLICATIONS

The present application claims priority under 35 U.S.C 119(a) to Korean application number 10-2010-0065592, filed on Jul. 7, 2010, in the Korean intellectual property Office, which is incorporated herein by reference in its entirety set forth in full.

BACKGROUND

Exemplary embodiments of the present invention relate to a semiconductor memory device and a method for fabricating the same, and more particularly, to a semiconductor memory device having a vertical transistor, a buried bit line and a method for fabricating the same.

Recently, as mobile devices are used widely and digital home appliances are fabricated in a smaller size, the degree of integration of semiconductor memory devices constituting the mobile devices or the digital home appliances is increasing. Particularly, in the case of a DRAM device or a flash memory device, various attempts have been performed in order to store a great quantity of information in a limited space. In general, a DRAM device includes a transistor and a capacitor, and has a stack structure in which the transistor is formed on a silicon substrate and the capacitor is formed thereon.

For an electrical connection between the transistor and the capacitor, a storage node contact is formed between a source region of the transistor and a lower electrode of the capacitor. A drain region of the transistor is electrically coupled to a bit line through a bit line contact. As described above, in the structure in which the capacitor is formed on the transistor, layers (for example, a word line and a bit line) for signal transmission are formed between the transistor and the capacitor. However, there is a limitation in increasing the capacity of the capacitor due to the space occupied by the layers for signal transmission. Moreover, if a gate width of the planar type transistor is approximately 40 nm or less, an amount of a body current, which is a leakage current between the source region and the drain region thereof, may increase. Therefore, researches related to a vertical transistor are being conducted.

FIG. 1 is a diagram explaining the basic concept of a vertical transistor. Referring to FIG. 1, the vertical transistor 100 has a structure in which a drain region 112 is formed at a lower portion of a silicon substrate 110, and a source region 114 is formed at an upper portion of the silicon substrate 110. A channel region 116 is formed between the drain region 112 and the source region 114, a gate dielectric layer 118 and a gate electrode 120 are sequentially formed on the lateral side of the silicon substrate 110, i.e., on the channel region 116. When the vertical transistor 100 as described above is applied to a DRAM device, a bit line is coupled to the drain region 112 and a storage node is coupled to the source region 114. Since the bit line is formed to be buried in the side of the lower portion of the silicon substrate 110, the space in which the storage node is to be formed may not decrease. Thus, data storage capacity may be improved in spite of high integration degree.

However, in order to form the vertical transistor as described above, the drain region 112 may be formed at the lower portion of the silicon substrate 110, but a process for forming the drain region 112 may be difficult. For example, according to a known art, a heavily doped conductive layer is formed at a side of the lower portion of the silicon substrate 110 at which the drain region 112 is to be formed, and dopants doped in the conductive layer are diffused into the silicon substrate 110, so that the drain region 112 may be formed. However, in such a case, since it may be difficult to appropriately adjust the size of the drain region 112 and the concentration of the dopant, mass production efficiency may decrease.

SUMMARY

An exemplary embodiment of the present invention relates to a semiconductor memory device with a simple fabrication process, in which an ohmic contact is formed between a drain region of a vertical transistor and a buried bit line, and a method for fabricating the same.

According to an exemplary embodiment of the present invention, a semiconductor memory device includes an active region protruding upward from a substrate, wherein the active region is arranged next to a trench on the substrate, a first impurity region formed at an upper portion of the active region, a second impurity region formed at a lower portion of the active region, a gate dielectric layer formed along a side of the active region between the first impurity region and the second impurity region, a gate electrode layer formed on the gate dielectric layer, a buried bit line formed at a lower portion of the trench, and a polysilicon layer formed over the buried bit line, wherein the polysilicon layer electrically connects the buried bit line with the second impurity region.

According to another exemplary embodiment of the present invention, a method for fabricating a semiconductor memory device includes forming a trench on a substrate to form an active region protruding upward from the substrate, forming a first liner layer over the substrate in which the trench is formed, forming a bit line over the first liner layer formed at a lower portion of the trench, forming an open region by selectively removing the first liner layer formed on the metal layer, and forming a polysilicon layer over the bit line, wherein the polysilicon layer electrically connects the buried bit line with the second impurity region through the open region.

According to yet another exemplary embodiment of the present invention, a semiconductor memory device includes an active region protruding upward from a substrate, wherein the active region is arranged next to a trench on the substrate, a first impurity region formed at an upper portion of the active region, a second impurity region formed at a lower portion of the active region, a gate dielectric layer formed along a side of the active region between the first impurity region and the second impurity region, a gate electrode layer formed on the gate dielectric layer, a first buried bit line formed at a lower portion of the trench, and a second buried bit line formed over the first buried bit line, wherein the second buried bit line electrically connects the first buried bit line with the second impurity region.

The forming of the bit line may include forming a metal layer having a first height on the first liner layer formed at the lower portion of the trench, removing the first liner layer, which is exposed on the metal layer having the first height, by a first thickness, forming a second liner layer in an area where the first liner layer is removed, and forming a metal layer having a second height by etching the metal layer having the first height.

The forming of the open region includes forming a third liner layer on the first liner layer exposed on the metal layer having the second height, and the second liner layer, forming a sacrificial layer by filling a trench on the third liner layer and the metal layer having a second height, selectively exposing an upper portion of the third liner layer adjacent to a side of the active region, selectively etching the third liner layer, and exposing the second impurity region by removing the sacrificial layer and an exposed part of the first liner layer.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
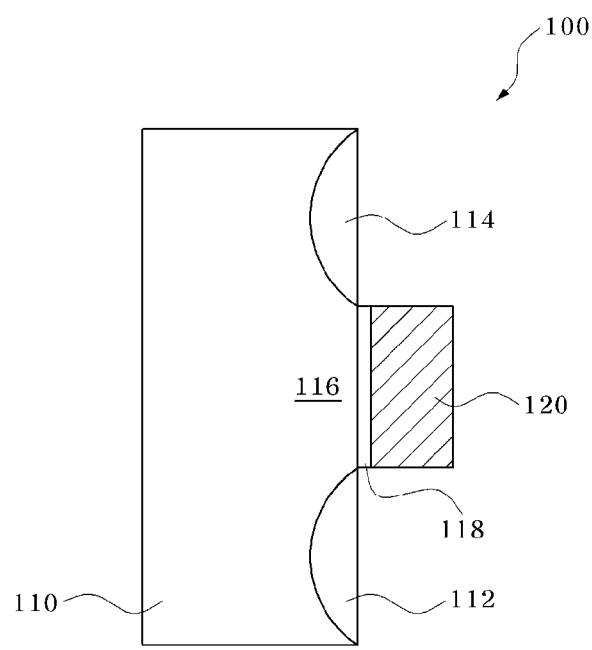
FIG. 1 is a diagram explaining the basic concept of a vertical transistor.
Figure 2:
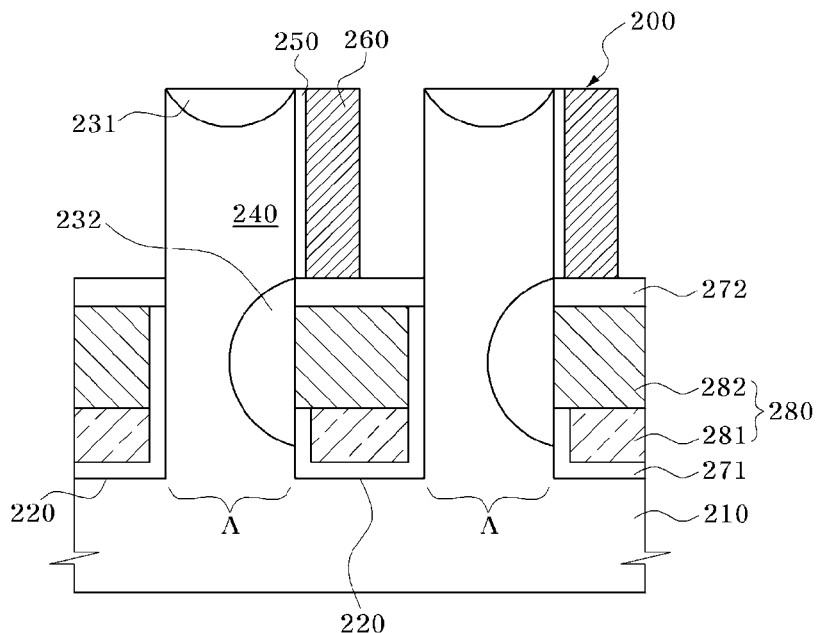
FIG. 2 is cross-sectional view illustrating a semiconductor memory device having a vertical transistor and a buried bit line according to an exemplary embodiment of the present invention.

FIG. 2 is a cross-sectional view illustrating a semiconductor memory device having a vertical transistor and a buried bit line according to an exemplary embodiment of the present invention. Referring to FIG. 2, in the semiconductor memory device 200 according to the exemplary embodiment of the present invention, an active region A protruding from a substrate 210 is formed by forming a trench 220 on the substrate 210 such as a silicon substrate. A first impurity region (for example, a source region 231) serving as a storage node junction region is formed at the upper portion of the active region A. A second impurity region (for example, a drain region 232) serving as a buried bit line junction region is formed at the lower portion of the active region A, in detail, below the right sidewall of the active region A. A channel region 240 is formed between the source region 231 and the drain region 232. In this exemplary embodiment, the channel region 240 is formed on a lateral side of the active region A. A gate dielectric layer 250 and a gate electrode layer 260 are sequentially formed on the channel region 240, that is, the lateral side of the active region A. A first bit line 281 is formed on a liner layer 271 which is formed on the surface of the trench 220. The liner layer 271 includes an oxide layer. In such a case, the oxide layer may have a thickness of approximately 10 Å to approximately 200 Å. A second bit line 282 is formed on the first bit line 281 and the liner layer 271. The first bit line 281 and the second bit line 282 may constitute a buried bit line 280. Also, the second bit line 282 may be cut by a subsequent etching process. In this case, the second bit line 282 may remain as a kind of a contact plug. The second bit line 282 is electrically isolated from the gate electrode layer 260 by an insulating layer 272 formed on the second bit line 282. Although not shown in FIG. 2, the gate electrode layer 260 and the buried bit line 280 may be formed as lines crossing each other.

The first bit line 281 may include a metal layer, and is insulated from the substrate 210 and the drain region 232 by the liner layer 271. The metal layer includes a titanium nitride (TiN) layer, a tungsten nitride (WN) layer, a tantalum (Ta) layer, a tantalum nitride (TaN) layer, a tungsten silicide (WSi2) layer, a tungsten (W) layer or a combination thereof. The metal layer may have a thickness of approximately 100 Å to approximately 1000 Å. The second bit line 282 includes a polysilicon layer doped with an impurity, and may have a sidewall that makes direct contact with the drain region 232. Here, the second bit line 282 may have a sidewall that makes the ohmic contact with the drain region 232. The polysilicon layer has a thickness of approximately 10 Å to approximately 200 Å. The impurity doped into the polysilicon layer includes arsenic (As) or phosphorus (P).

As described above, the semiconductor memory device 200 according to the exemplary embodiment of the present invention has a structure in which the first bit line 281 does not make contact with the drain region 232 but the second bit line 282 makes contact with the drain region 232. Thus, an ohmic contact may be naturally formed at a contact part between the drain region 232 and the second bit line 282. According to a known art, a metal silicide layer is formed between the metal layer and the drain region 232 in order to form an ohmic contact. In such a case, since the metal silicide layer may be agglomerated through a subsequent heating process and the like, the metal silicide layer may have a non-uniform thickness, resulting in an increase in a contact resistance. Even if the ohmic contact is formed without forming the metal silicide layer, an undesired layer, for example, a nitride-based layer, may be formed on a contact surface between the metal layer and the drain region 232. However, in this exemplary embodiment, since the second bit line 282 making direct contact with the drain region 232 includes the doped polysilicon layer, the ohmic contact is basically formed at the contact part therebetween. Consequently, a separate metal silicide layer for the ohmic contact is not necessary, and an undesired nitride-based layer is not also formed. Moreover, since the first bit line 281 is formed in a remaining region except for the part making contact with the drain region 232, the total resistance of the bit line 280 may also decrease as compared with the case of configuring a bit line by using only a polysilicon layer.

Figure 3:
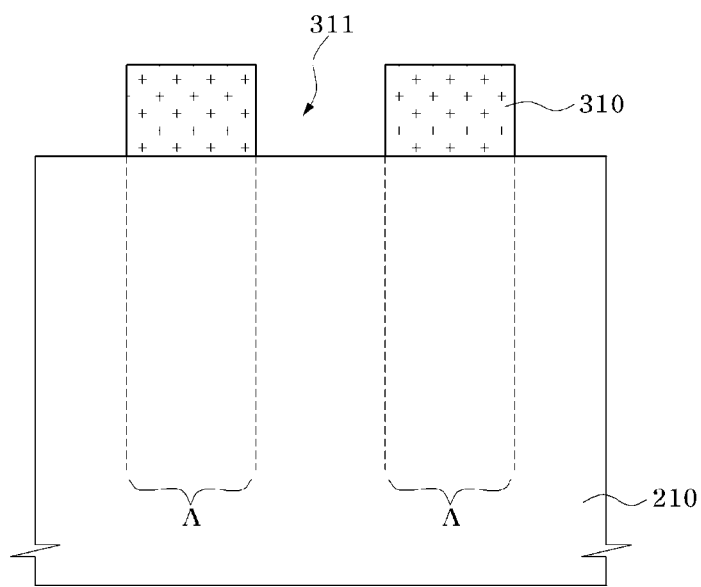
FIGS. 3 to 12 are cross-sectional view explaining a method for fabricating a semiconductor memory device having a vertical transistor and a buried bit line of FIG. 2.

FIGS. 3 to 12 are cross-sectional view explaining a method for fabricating the semiconductor memory device having the vertical transistor and the buried bit line according to the exemplary embodiment of the present invention. Referring to FIG. 3, a hard mask pattern 310 is formed on the substrate 210 such as a silicon substrate. According to an example, the hard mask pattern 310 may be formed using a nitride pattern, or may be formed by sequentially stacking an oxide pattern and a nitride pattern. The hard mask pattern 310 may be formed to have a thickness of approximately 500 Å to approximately 3000 Å. The hard mask pattern 310 is formed with an opening 311 through which the surface of the substrate 210 is partially exposed. Through the opening 311, the surface of the substrate 210, in which a trench defining the active region A of the substrate 210 is to be formed, is exposed.

Figure 4:
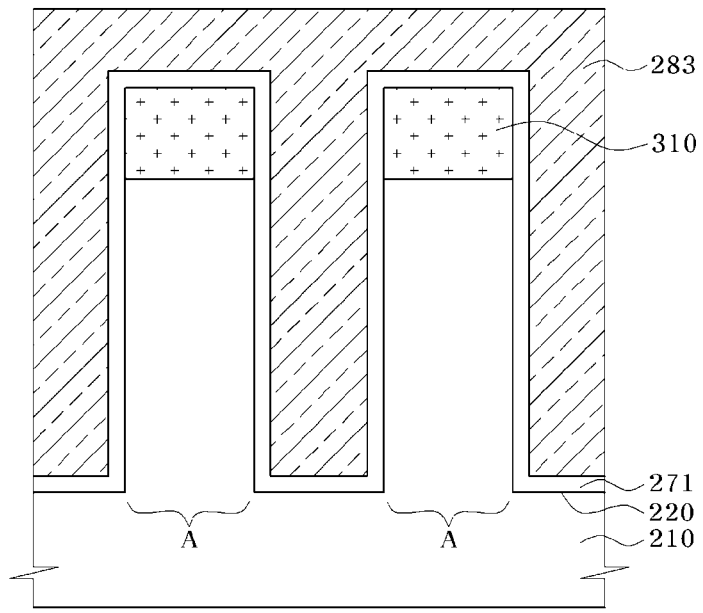

Referring to FIG. 4, the exposed part of the substrate 210 is removed by a certain depth through an etching process using the hard mask pattern 310 as an etch mask, thereby forming the trench 220. The active region A protruding from the substrate 210 is defined by the trench 220, and the height of the active region A is determined according to the depth of the trench 220. The first liner layer 271 is formed on the substrate 210 including the trench 220. The first liner layer 271 may be formed of an oxide having a thickness of approximately 10 Å to approximately 200 Å. A metal layer 283 is formed on the first liner layer 271 such that the trench 220 is filled. The metal layer 283 may be formed of a titanium nitride (TiN), a tungsten nitride (WN), a tantalum (Ta), a tantalum nitride (TaN), a tungsten silicide (WSi2), a tungsten (W) or a combination thereof.

Figure 5:
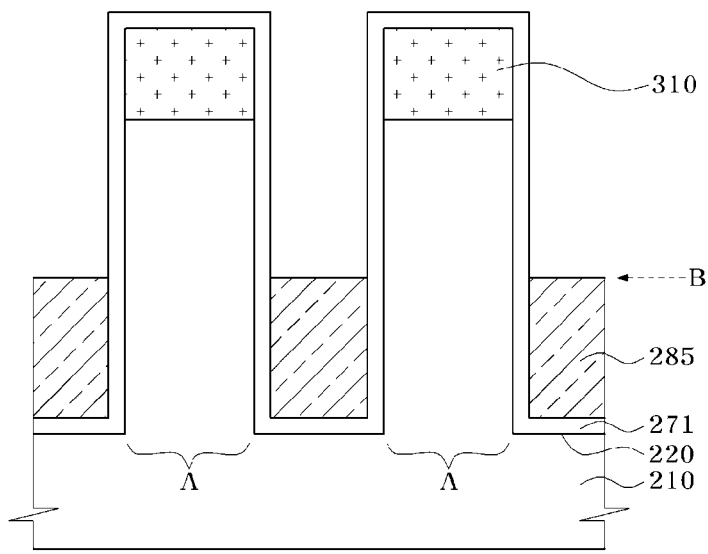

Referring to FIG. 5, a first etching process for recessing the metal layer 283 is performed, so that a metal layer 285 having a first height remains in the lower portion of the trench 220. The first etching process may be performed using an etch-back process. If necessary, a planarization process may be performed before the etch-back process is performed. The position (refer to the part indicated by "B" in FIG. 5), at which the upper surface of the recessed metal layer 285 having the first height is located, substantially coincides with the upper end of an open region through which a drain region is opened in a subsequent process. In this regard, it is necessary to perform the etching process of the metal layer 283 by taking the position of the upper end position of the open region of the drain region into consideration.

Figure 6:
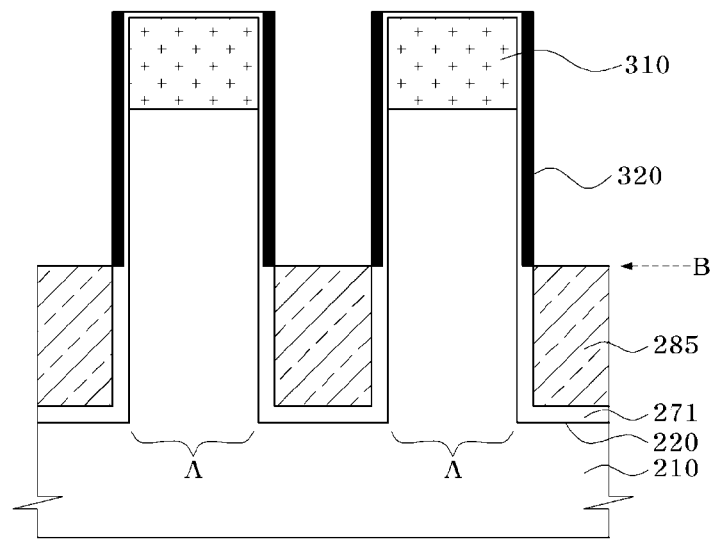

Referring to FIG. 6, the first liner layer 271 exposed over the metal layer 285 having the first height is removed by a certain thickness. A second liner layer 320 in the form of a spacer may be formed on the first liner layer 271 removed by the certain thickness.

The second liner layer 320 may be formed to have a thickness of approximately 10 Å to approximately 200 Å, and formed of a material having a sufficient etching selectivity to selectively etch the first liner layer 271. Consequently, at the time of subsequent etching for the first liner layer 271, the second liner layer 320 may be minimally affected by the etching process. According to an example, if the first liner layer 271 is formed of an oxide, the second liner layer 320 may be formed of a nitride. In order to form the second liner layer 320 in the form of the spacer, a material layer (not shown) for a second liner layer may be formed on the resultant structure including the first liner layer 271 although not shown in FIG. 6. An anisotropic etching process, for example, an etch back process, may be performed on the material layer, thereby forming the second liner layer 320 in the form of the spacer.

Figure 7:
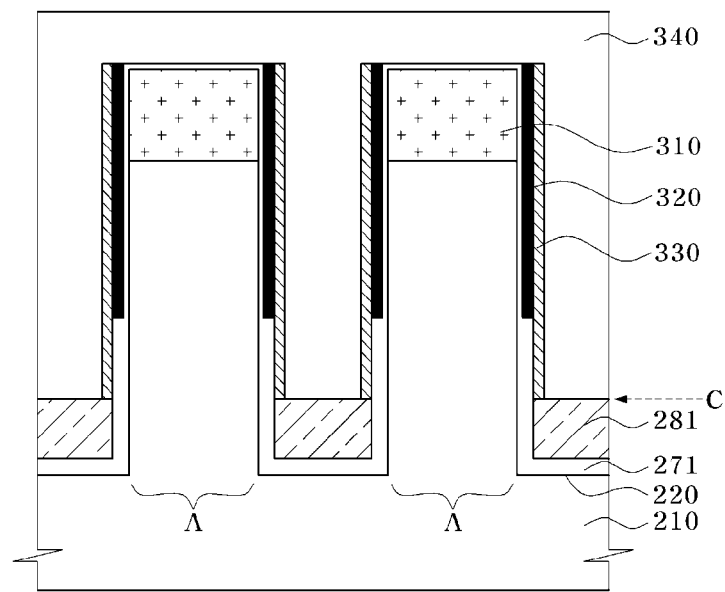

Referring to FIG. 7, a second etching process is performed with respect to the recessed metal layer (285 of FIG. 6) having the first height, thereby forming a metal layer 281 having a second height and serving as a first bit line. This process may also be performed in the process of forming the second liner layer 320 in the form of the spacer. The second thickness of the metal layer 281 coincides with the lower end of the open region of the drain region. That is, the position (refer to the part indicated by "C" in FIG. 7), at which the upper surface of the metal layer 281 having the second height is located, substantially coincides with the lower end of the open region of the drain region formed in a subsequent process. According to an example, the width of the open region (that is, the vertical length of the open region of the drain region), by which the metal layer (285 of FIG. 6) is removed, may be set to approximately 100 Å to approximately 700 Å, and the final height of the metal layer 281 may be set to approximately 100 Å to approximately 1000 Å.

As the metal layer 281 is formed, a part of the first liner layer 271 is exposed between the metal layer 281 and the second liner layer 320. In such a state, a third liner layer 330 is formed on the first liner layer 271 exposed on the metal layer 281, and the second liner layer 320. In order to form the third liner layer 330 in the form of the spacer, a material layer (not shown) for a third liner layer may be formed on the resultant structure including the first liner layer 271 and the second liner layer 320, and an anisotropic etching process may be performed with respect to the material layer for the third liner layer. The third liner layer 330 is formed of a material having a high etching selectivity with respect to the first liner layer 271. In an example, the third liner layer 330 may be formed of a polysilicon. A sacrificial layer 340 is formed on the resultant structure including the third liner layer 330 such that the trench 220 in the third liner layer 330 is filled. The sacrificial layer 340 may be formed of the same material as that of the first liner layer 271. That is, if the first liner layer 271 is formed of an oxide, the sacrificial layer 340 is also formed of the oxide layer. Consequently, the sacrificial layer 340 also may have a sufficient etching selectivity with respect to the third liner layer 330 as with the first liner layer 271, so that the sacrificial layer 340 is minimally affected by a subsequent etching process for removing the third liner layer 330.

Figure 8:
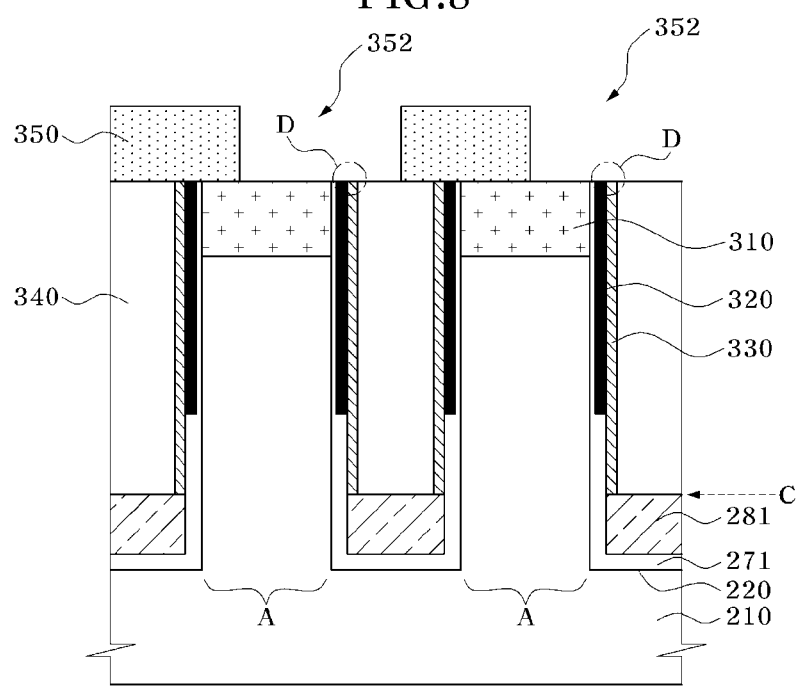

Referring to FIG. 8, a planarization process is performed with respect to the sacrificial layer 340 to allow, for example, only the sacrificial layer 340 to remain in the trench 220. A mask pattern 350 for selectively removing the third liner layer 330 is formed on the resultant structure including the sacrificial layer 340. The mask pattern 350 may be formed of a photoresist. As indicated by "D" in FIG. 8, the third liner layer 330 located at a side of the active region A, that is, the third liner layer 330 to be selectively removed is exposed through an opening 352 of the mask pattern 350. However, the third liner layer 330 located at the other side thereof, that is, the third liner layer 330 not to be removed is covered by the mask pattern 350. Although the method for selectively removing the third liner layer 330 by using the mask pattern 350 has been described, this is for illustrative purposes only, and it goes without saying that other methods may be used.

Figure 9:
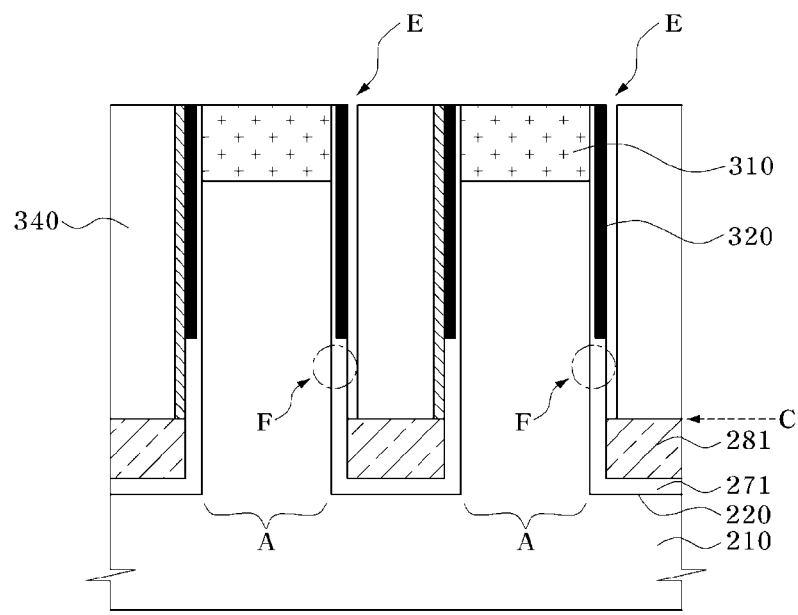

Referring to FIG. 9, the third liner layer 330 exposed through the opening 352 of the mask pattern (350 of FIG. 8) is etched to expose the first liner layer 271 on the metal layer 281. This process may be performed using a wet etching method. In this process, since the sacrificial layer 340 includes a material having a high etching selectivity with respect to the third liner layer 330, the sacrificial layer 340 may not be affected by the etching process. After the etching process is ended, the mask pattern (350 of FIG. 8) is removed. As indicated by "E" in FIG. 9, as the third liner layer 330 is selectively removed, an empty space is created in the trench 220. A side of the lower portion of the active region A, that is, the first liner layer 271 next to the open region of the drain region is exposed through the empty space (refer to the part indicated by "F" in FIG. 9).

Figure 10:
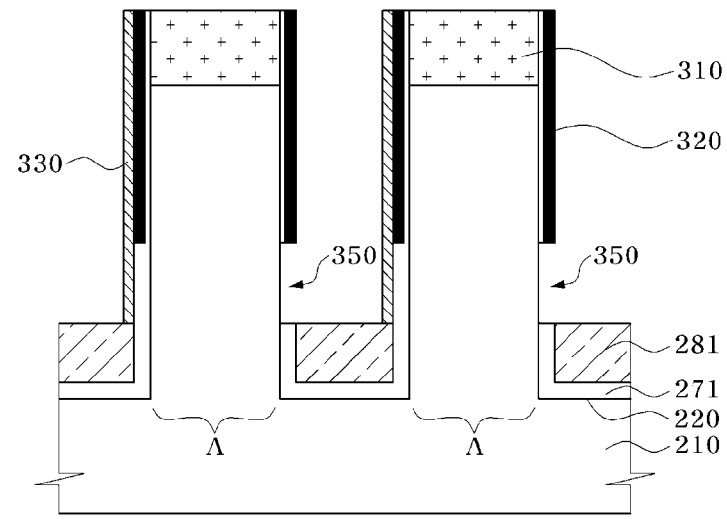

Referring to FIG. 10, the sacrificial layer 340 is removed. Since the sacrificial layer 340 and the first liner layer 271 are formed of the same material, the exposure part of the first liner layer 271 is also removed in the process of removing the sacrificial layer 340. Although the sacrificial layer 340 and the first liner layer 271 are formed of the same material, the amount of the sacrificial layer 340 to be removed is larger than the amount of the first liner layer 271 to be removed. In this regard, the sacrificial layer 340 and the first liner layer 271 may be formed of materials having an etching selectivity. For example, the first liner layer 271 is formed of a LP-TEOS oxide and the sacrificial layer 340 is formed of a SOD (spin on dielectric) oxide. As the first liner layer 271 is removed, the lateral side of the active region A is exposed, and this exposed region serves as the open region 350 of the drain region. An etching process for etching the sacrificial layer 340 and the first liner layer 271 may be performed using a wet etching method.

Figure 11:
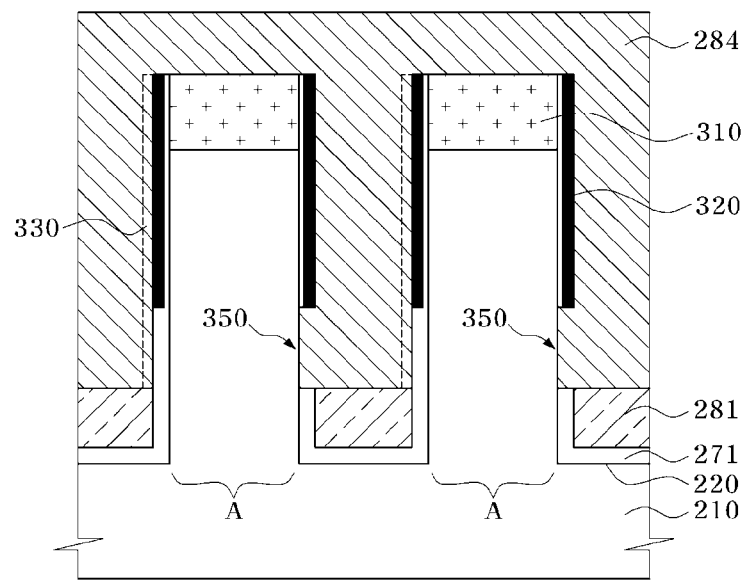

Referring to FIG. 11, a polysilicon layer 284 doped with an impurity ion is formed on the resultant structure of the substrate 210 such that the trench 220 is filled. The impurity ion doped in the polysilicon layer 284 includes phosphorous (P) or arsenic (As). If necessary, an impurity ion of an opposite conductive type may also be doped in the polysilicon layer 284. The doping concentration of the impurity ion doped in the polysilicon layer 284 is determined by considering the concentration of the drain region to be formed through a subsequent diffusion process. However, as the drain region makes direct contact with the polysilicon layer 284, an ohmic contact may be naturally formed. Consequently, it is not necessary to form an impurity ion of high concentration on a contact surface between the metal layer and the open region 350 of the drain region in order to form the ohmic contact.

Figure 12:
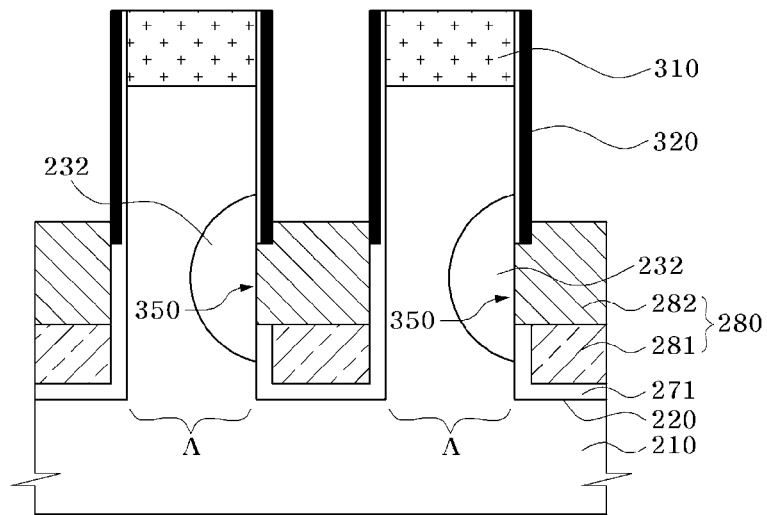

Referring to FIG. 12, an etch-back process is performed with respect to the polysilicon layer (284 of FIG. 11) doped with the impurity ion, so that the polysilicon layer having a certain height remains, for example, only in the trench 220 and others are moved. The thickness by which the polysilicon layer is removed is set such that the upper surface of a remaining polysilicon layer 282 is higher than the upper end of the open region 350 of the drain region. If necessary, a planarization process may be performed before the etch-back process is performed. The polysilicon layer 282 remaining in the trench 220 may be a second bit line. In this case, the bit line 280 includes the first bit line formed of the metal layer 281 and the second bit line formed of the polysilicon layer 282. As the second bit line formed of the polysilicon layer 282 is formed at the upper portion of the bit line 280, even if the bit line 280 is exposed and oxidized in a subsequent process, it does not exert a significant influence on the subsequent process. A heating process is performed to diffuse the impurity ion in the polysilicon layer 282 into the active region A, thereby forming the drain region 232, that is, the buried bit line junction region. According to an example, the heating process may be performed at the temperature of approximately 700° C. or more.

As shown in FIG. 2, the insulating layer 272 is formed on the polysilicon layer 282. The source region 231 serving as the storage node junction region is formed on the active region A to define the channel region 240. The gate dielectric layer 250 and the gate electrode layer 260 are sequentially formed on the channel region 240.

According to the Known art, if a metal layer makes direct contact with a buried bit line junction region, it may be necessary to maintain high dopant concentration in order to form an ohmic contact on a contact surface between the metal layer and the buried bit line junction region. However, according to the exemplary embodiments of the present invention, as a polysilicon layer makes direct contact with a buried bit line junction region, an ohmic contact may be naturally formed, so that the polysilicon layer may be doped with low dopant concentration, and thus a doping profile of the buried bit line junction region may be formed more easily. Moreover, since a metal silicide for forming the ohmic contact is not necessary, a probability of a deterioration of a property due to non-uniform thickness of metal silicide may decrease. In addition, since the polysilicon layer is formed at the upper portion of the bit line, even if the polysilicon layer is exposed and oxidized in a subsequent process, it does not exert a significant influence on the subsequent process as compared with the case in which a metal layer is oxidized.

Although preferred embodiments of the invention have been disclosed for illustrative purposes, those skilled in the art will appreciate that various modifications, additions and substitutions are possible, without departing from the scope and spirit of the invention as defined in the accompanying claims.

What is claimed is:

1. A semiconductor memory device comprising:
   an active region protruding upward from a substrate, wherein the active region is arranged next to a trench on the substrate;
   a first impurity region formed at an upper portion of the active region;
   a second impurity region formed at a lower portion of the active region;
   a gate dielectric layer formed along a side of the active region between the first impurity region and the second impurity region;
   a gate electrode layer formed on the gate dielectric layer;
   a first bit line formed at a lower portion of the trench, wherein the first buried bit line is spaced apart from the second impurity region by a liner layer; and
   a second buried bit line formed over the first buried bit line, wherein the second buried bit line directly connects with the second impurity region.

2. A semiconductor memory device comprising:
   an active region protruding upward from a substrate, wherein the active region is arranged next to a trench on the substrate;
   a first impurity region formed at an upper portion of the active region;
   a second impurity region formed at a lower portion of the active region;
   a gate dielectric layer formed along a side of the active region between the first impurity region and the second impurity region;
   a gate electrode layer formed on the gate dielectric layer;
   a buried bit line formed at a lower portion of the trench, wherein the first buried bit line is spaced apart from the second impurity region by a liner layer; and
   a polysilicon layer formed over the buried bit line, wherein the polysilicon layer directly connects with the second impurity region.

3. The semiconductor memory device of claim 2, wherein the liner layer includes an oxide layer.

4. The semiconductor memory device of claim 3, wherein the oxide layer has a thickness of approximately 10 Å to approximately 200 Å.

5. The semiconductor memory device of claim 2, wherein the buried bit line includes a titanium nitride (TiN) layer, a tungsten nitride (WN) layer, a tantalum (Ta) layer, a tantalum nitride (TaN) layer, a tungsten silicide (WSi2) layer, a tungsten (W) layer or a combination thereof.

6. The semiconductor memory device of claim 2, wherein the buried bit line has a height of approximately 100 Å to approximately 1000 Å.

7. The semiconductor memory device of claim 2, wherein the polysilicon layer has a height of approximately 10 Å to approximately 200 Å.

8. The semiconductor memory device of claim 2, wherein the polysilicon layer is doped with an impurity.

9. The semiconductor memory device of claim 8, wherein the impurity includes arsenic (As) or a phosphorous (P).

10. The semiconductor memory device of claim 2, further comprising an insulating layer formed between the polysilicon layer and the gate dielectric layer.

* * * * *